United States Patent
Zheng et al.

(10) Patent No.: US 9,652,099 B2
(45) Date of Patent: May 16, 2017

(54) ARRAY SUBSTRATE AND MANUFACTURING METHOD THEREOF, TOUCH DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Dan Zheng, Beijing (CN); Haibo Zhu, Beijing (CN); Linlin Lu, Beijing (CN); Jianmin Duan, Beijing (CN); Jingxian Jin, Beijing (CN); Hongyou Gong, Beijing (CN); Yulei Zhai, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/647,574

(22) PCT Filed: Nov. 21, 2014

(86) PCT No.: PCT/CN2014/091903
§ 371 (c)(1),
(2) Date: May 27, 2015

(87) PCT Pub. No.: WO2016/004719
PCT Pub. Date: Jan. 14, 2016

(65) Prior Publication Data
US 2016/0048239 A1 Feb. 18, 2016

(30) Foreign Application Priority Data
Jul. 8, 2014 (CN) .......................... 2014 1 0323275

(51) Int. Cl.
*G06F 3/044* (2006.01)
*H01L 21/77* (2017.01)
(Continued)

(52) U.S. Cl.
CPC ............ *G06F 3/044* (2013.01); *G06F 3/0412* (2013.01); *H01L 21/77* (2013.01); *H01L 27/12* (2013.01);
(Continued)

(58) Field of Classification Search
CPC ................... G06F 3/0412; G06F 3/044; G06F 2203/04103; G06F 2203/04111
See application file for complete search history.

(56) References Cited

U.S. PATENT DOCUMENTS 7,859,521 B2 * 12/2010 Hotelling .............. G06F 3/0412
178/18.03
9,092,103 B2 * 7/2015 Choi ..................... G06F 3/0412
(Continued)

FOREIGN PATENT DOCUMENTS

CN 102709236 A 10/2012
CN 203133452 U 8/2013
(Continued)

OTHER PUBLICATIONS

International Search Report of the International Searching Authority of PCT/CN2014/091903 in Chinese, mailed on Mar. 25, 2015.
(Continued)

*Primary Examiner* — Benjamin C Lee
*Assistant Examiner* — Xuemei Zheng
(74) *Attorney, Agent, or Firm* — Collard & Roe, P.C.

(57) ABSTRACT

An array substrate and its manufacturing method, and a touch display device are disclosed. A display area of the array substrate includes a plurality of thin film transistor (11), first transparent electrodes (12), second transparent
(Continued)

electrodes (13) and a transparent insulation layer (16) that contacts the second transparent electrodes (13); the transparent insulation layer (16) is a conductor when a voltage applied thereon is larger than a predetermined voltage, and is an insulator when the voltage applied therein is less than the predetermined voltage. The second transparent electrodes (13) include first sub-electrodes (131) arranged into a plurality of rows in a first direction and insulated from each other, and second sub-electrodes (132) arranged into a plurality of rows in a second direction and insulated from each other, the first direction is intersected with the second direction. The problems such as noise, visual artifacts, insensitive to touch, or the like caused by unbalance of charges can be avoided.

13 Claims, 4 Drawing Sheets

(51) Int. Cl.
*H01L 29/423* (2006.01)
*H01L 27/12* (2006.01)
*G06F 3/041* (2006.01)
*G09G 3/36* (2006.01)

(52) U.S. Cl.
CPC ........ *H01L 27/124* (2013.01); *H01L 27/1262* (2013.01); *H01L 29/423* (2013.01); *G06F 2203/04103* (2013.01); *G06F 2203/04111* (2013.01); *G06F 2203/04112* (2013.01); *G09G 3/3648* (2013.01)

(56) References Cited

U.S. PATENT DOCUMENTS

| | | | | |
|---|---|---|---|---|
| 9,195,331 | B2* | 11/2015 | Yu | G06F 3/044 |
| 2013/0141343 | A1* | 6/2013 | Yu | G06F 3/044 |
| | | | | 345/173 |
| 2013/0153911 | A1 | 6/2013 | Zhang et al. | |
| 2013/0306361 | A1 | 11/2013 | Kim et al. | |
| 2014/0062943 | A1* | 3/2014 | Choi | G06F 3/0412 |
| | | | | 345/174 |
| 2014/0176465 | A1 | 6/2014 | Ma et al. | |
| 2015/0138100 | A1* | 5/2015 | Lin | G06F 1/26 |
| | | | | 345/173 |
| 2015/0286329 | A1* | 10/2015 | Choi | G06F 3/0412 |
| | | | | 345/174 |
| 2015/0378486 | A1* | 12/2015 | Yu | G06F 3/0412 |
| | | | | 345/174 |
| 2016/0035304 | A1 | 2/2016 | Zheng et al. | |

FOREIGN PATENT DOCUMENTS

| | | |
|---|---|---|
| CN | 103293785 A | 9/2013 |
| CN | 103543567 A | 1/2014 |
| CN | 104103647 A | 10/2014 |

OTHER PUBLICATIONS

Written Opinion of the International Searching Authority of PCT/CN2014/091903 in Chinese, mailed on Mar. 25, 2015 with an English translation.
Chinese Office Action in Chinese Application No. 201410323275.9, mailed May 9, 2016 with English translation.
Second Chinese Office Action in Chinese Application No. 201410323275.9, mailed Oct. 27, 2016 with English translation.

* cited by examiner

US 9,652,099 B2

ARRAY SUBSTRATE AND MANUFACTURING METHOD THEREOF, TOUCH DISPLAY DEVICE

CROSS REFERENCE TO RELATED APPLICATIONS

This application is the National Stage of PCT/CN2014/091903 filed on Nov. 21, 2014, which claims priority under 35 U.S.C. §119 of Chinese Application No. 201410323275.9 filed on Jul. 8, 2014, the disclosure of which is incorporated by reference.

TECHNICAL FIELD

At least one embodiment of the present invention relates to an array substrate and its manufacturing method, and a touch display device.

BACKGROUND

With the quick development of the display technology, the touch panels render people's daily life more convenient.

The touch panel includes add-on touch panels and in-cell touch panels. An add-on touch panel has a structure in which the touch panel and a display panel are adhered together. However, this technology suffers from the defects such as high manufacturing costs, low light transmittance, large module thickness, and so on. Therefore, with development of technology, in-cell touch panels become more and more attractive in R&D.

Currently, the touch sensing method for in-cell touch panels is mutual capacitance type, for example, the mutual capacitance in-cell touch panel includes a color film substrate and an array substrate provided opposite to each other, touch driving electrodes and touch sensing electrodes may be provided on the array substrate. The principle for such kind of touch panel is that, when a touch driving signal is applied on a touch driving electrode, an induced voltage signal on the touch sensing electrode generated by mutual capacitance coupling can detected, during this period, if someone touches the touch panel, the electrical field of the human body will act on the mutual capacitance so that the value of the mutual capacitance is varied, whereby the induced voltage signal on the touch sensing electrode generated by mutual capacitance coupling is varied as well, and thus the touch position can be determined by the variation of the induced voltage signal.

SUMMARY

At least one embodiment of the present invention provides an array substrate and its manufacturing method, and a touch display device, by which the problem of the display device, such as noise, visual artifacts, bad sensitivity to touch, and so on caused by charge unbalance can be avoided.

In one aspect, at least one embodiment of the present invention provides an array substrate including a display area and a peripheral area, the display area includes a plurality of thin film transistors provided a base substrate, first transparent electrodes electrically connected with drain electrodes of the thin film transistors, second transparent electrodes, and a transparent insulation layer that contacts the second transparent electrodes. The transparent insulation layer becomes a conductor when a voltage applied on the transparent insulation layer is larger than a predetermined voltage, and is an insulator when the voltage applied on the transparent insulation layer is less than the predetermined voltage. The second transparent electrodes include first sub-electrodes arranged into a plurality of rows in a first direction, and second sub-electrodes arranged into a plurality of rows in a second direction. The first sub-electrodes in different rows are insulated from each other, and the second sub-electrodes in different rows are insulated from each other, and the first sub-electrodes and the second sub-electrodes are insulated from each other. The first direction is intersected with the second direction.

In another aspect, at least one embodiment of the present invention provides a method for manufacturing an array substrate including a display area and a peripheral area. The method includes: forming a plurality of thin film transistors located on a base substrate, first transparent electrodes electrical connected with drain electrodes of the thin film transistors, second transparent electrodes and a transparent insulation layer that contacts the second transparent electrodes in the display area, wherein the transparent insulation layer becomes a conductor when a voltage applied on the transparent insulation layer is larger than a predetermined voltage, and is an insulator when the voltage applied on the transparent insulation layer is less than the predetermined voltage, the second transparent electrodes include first sub-electrodes arranged into a plurality of rows in a first direction, and second sub-electrodes arranged into a plurality of rows in a second direction, the first sub-electrodes in different rows are insulated from each other, and the second sub-electrodes in different rows are insulated from each other, and the first sub-electrodes and the second sub-electrodes are insulated from each other, and the first direction is intersected with the second direction.

In a further aspect, at least one embodiment of the present invention provides a touch display device including the above array substrate.

DESCRIPTION OF THE ATTACHED DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF REFERENCE NUMERALS

01—display area; 02—peripheral area; 10—base substrate; 11—thin film transistor; 111—drain electrode of the thin film transistor; 12—first transparent electrode; 13—second transparent electrode; 131—first sub-electrode; 131a—first sub-electrode segment; 132—second sub-electrode; 14—gate line; 15—data line; 16—transparent insulation layer; 17—first metal line; 18—second metal line.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The inventors of the present invention noticed that during manufacturing the in-cell touch panel or during the device is operated by a user, due to electrostatic discharge or other reasons, charges may be accumulated along a certain section of the touch driving electrode or the touch sensing electrode, the charges accumulated on the touch driving electrode or the touch sensing electrode will cause charge unbalance between the portions of the touch driving electrode or the touch sensing electrode, resulting in the problems such as noise, visual artifacts, bad sensitivity to touch, or the like.

Figure 1:
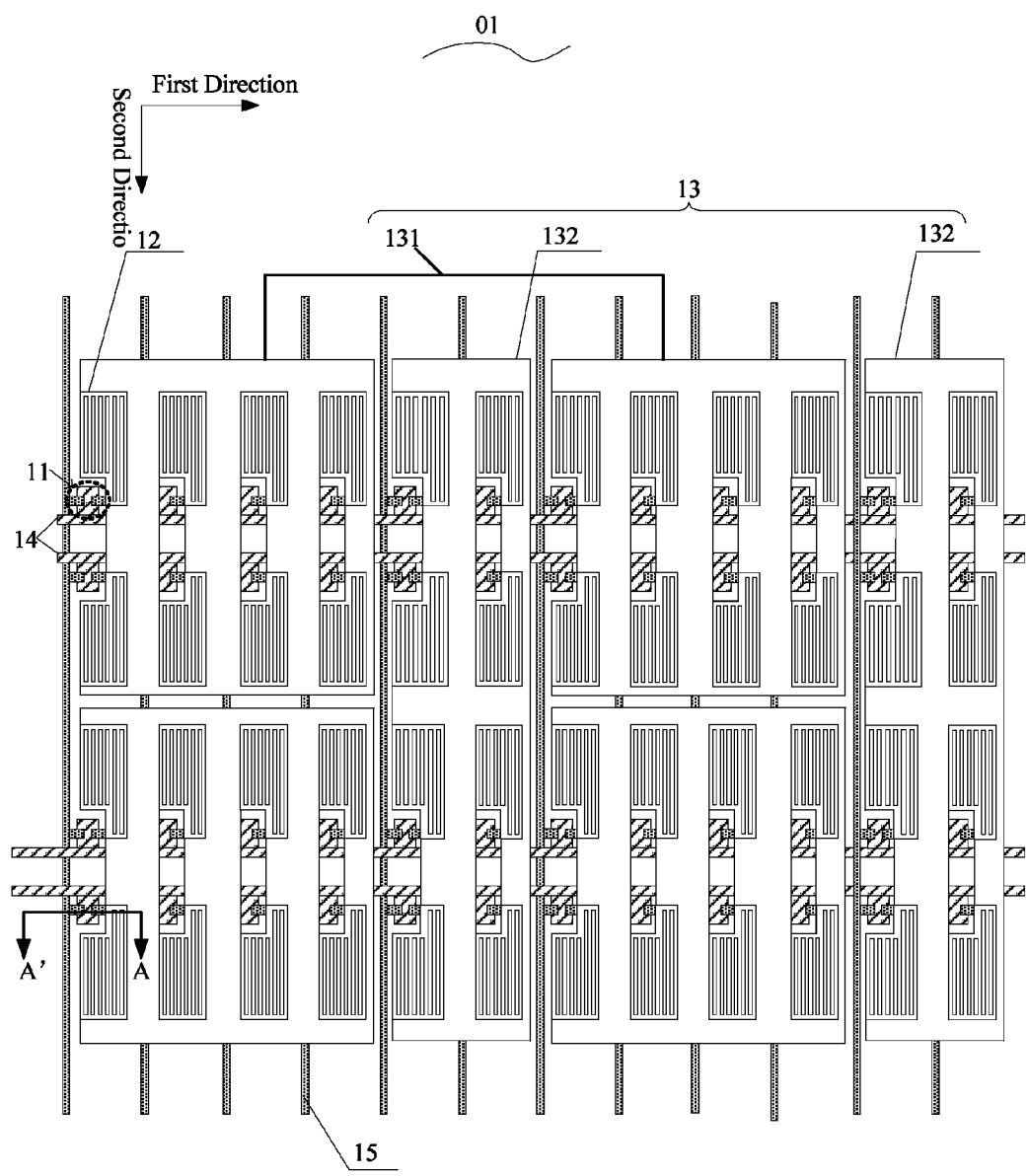
FIG. 1 is a schematic top view showing the structure of a display area of an array substrate provided by an embodiment of the present invention.
Figure 2:
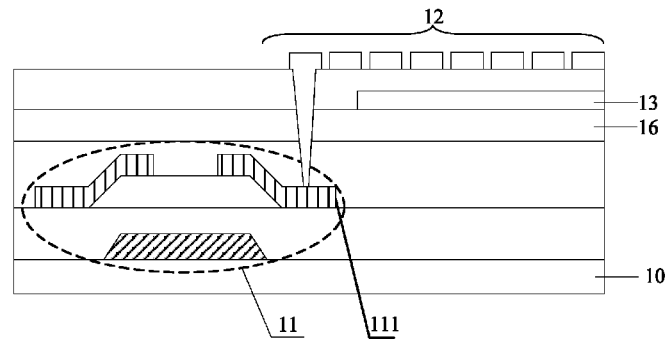
FIG. 2 is a schematic sectional view in the AA' direction in FIG. 1.

At least one embodiment of the present invention provides an array substrate including a display area and a peripheral area. As shown in FIG. 1 and FIG. 2, the display area 01 includes a plurality of thin film transistors 11 provided on a base substrate 10, first transparent electrodes electrically connected with drain electrodes 111 of the thin film transistors, and second transparent electrodes 13. The array substrate further includes a transparent insulation layer 16 that contacts the second transparent electrodes 13. Where the voltage applied on the transparent insulation layer 16 is larger than a predetermined voltage, the transparent insulation layer 16 becomes a conductor, while where the voltage applied on the transparent insulation layer 16 is less than the predetermined voltage, the transparent insulation layer 16 becomes an insulator.

In the above embodiment, the second transparent electrodes 13 include first sub-electrodes 131 arranged into a plurality of rows in a first direction, and second sub-electrodes 132 arranged into a plurality of rows in a second direction. The first sub-electrodes 131 in different rows are insulated from each other, the second sub-electrodes 132 in different rows are insulated for each other, and the first sub-electrodes 131 and the second sub-electrodes 132 are insulated from each other. The first direction is intersected with the second direction.

The thin film transistors 11 each includes a gate electrode, a gate insulation layer, a semiconductor active layer, a source electrode and a drain electrode. The array substrate further includes gate lines 14 connected with the gate electrodes and data lines 15 connected with the source electrodes.

In at least one embodiment, the material for the transparent insulation layer 16 may include a composite material, of course, the present embodiment is not limited thereto, and other material may be employed for the transparent insulation layer 16, as long as the transparent insulation layer 16 becomes a conductor when the voltage applied thereon is larger than the predetermined voltage, and becomes an insulator when the voltage applied thereon is less than the predetermined voltage.

It is noted that firstly, in the embodiment of the present invention, the array substrate has display and touch function. The display function is realized by applying common electrode signals on the first sub-electrodes 131 and the second sub-electrodes 132 of the second transparent electrodes 13 simultaneously to cooperate with the first transparent electrodes 12 to drive liquid crystal during a display period, at this time, the first sub-electrodes 131 and the second sub-electrodes 132 both function as common electrodes. The touch function is realized by applying driving signals and sensing signals on the first sub-electrodes 131 and the second sub-electrodes 132 respectively during a touch period, at this time, the first transparent electrodes 12 are not in operation, and the first sub-electrodes 131 and the second sub-electrodes 132 are mutually the touch driving electrodes and the touch sensing electrodes.

Secondly, the composite material is material which is obtained by combining two or more materials having different characteristics in microscope sense by means of a physical or chemical method to produce new performance. The materials cooperate with each other in performance and generate synergism so that the composite material has overall performance better than each of the constituent material to meet different requirements.

In an embodiment of the present invention, the composite material is a conductive high impedance composite material, that is, meets the high impedance, light transmittance and conductivity at the same time. Its high impedance means that when a relatively small voltage, e.g., of several volts is applied on the transparent insulation layer 16 formed from the composite material, it presents an insulation characteristics. Its conductivity means that when a relatively large voltage, e.g., of several tens volts is applied on the transparent insulation layer 16 formed from the composite material, it presents conductivity. Its light transmittance means that the composite material has a transmittance property of a certain degree.

Thirdly, since the transparent insulation layer 16 becomes a conductor when the voltage applied on the transparent insulation layer 16 is larger than the predetermined voltage and the transparent insulation layer 16 contacts the second transparent electrodes 13, as well known by the person skilled in the art, when the material for a pattern layer located below or above the transparent insulation layer is a conductive material and the second transparent electrodes 13 are not electrically connected with the pattern layer, it is necessary to provide a fully insulation layer formed from e.g., silicon oxide and/or silicon nitride between the conductive pattern layer and the transparent insulation layer 16.

Fourthly, given the first direction is the horizontal direction, the second transparent electrodes 13 include the first sub-electrodes 131 arranged into a plurality of rows in the first direction, that is, the second transparent electrodes 13 include a plurality of first sub-electrodes 131 arranged into a plurality of rows in the first direction. Given the second direction is the vertical direction, the second transparent electrodes 13 include second sub-electrodes 132 arranged into a plurality of rows in the second direction, that is, the second transparent electrodes 13 include a plurality of second sub-electrodes 132 arranged into a plurality of columns.

Based on the above, if the first sub-electrodes 131 in each of the rows are regarded as a whole, the first sub-electrodes 131 are extended from one side of the array substrate to the other side parallel with the one side. If the second sub-electrodes 132 in each of the columns are regarded as a whole, the second sub-electrodes 132 are extended from one side of the array substrate to the other side parallel with the one side. The four sides define the display area of the array substrate, and the first sub-electrodes 131 and the second sub-electrodes 132 are located at the same layer, resulting in intersection areas between the first sub-electrodes 131 and the second sub-electrodes 132. Therefore, if the first sub-electrodes 131 are needed to be insulated from the second sub-electrodes, the first sub-electrodes 131 in each row and/or the second sub-electrodes 132 in each column should be provided as a plurality of electrode segments. That is, at the intersection point between the row and the column, at least one kind of the sub-electrodes are disconnected, and at the broken portions in each row and/or each column, the sub-electrode segments in the row or the column should be connected by connecting lines provided in another layer.

Fifthly, the above fourth item is described by way of the example that the first direction is the horizontal direction and the second direction is the vertical direction, but the embodiments of the present invention should not be limited thereto, and according to the specific situation, it is that the first direction is intersected with the second direction.

Sixthly, there is no limitation on the positional relationship of the first transparent electrodes 12 and the second transparent electrodes 13 relative to the base substrate 10, and it is preferred that the second transparent electrodes 13 are located between the base substrate 10 and the first transparent electrodes 12.

An embodiment of the present invention provides an array substrate including a display area 01 and a peripheral area. The display area 01 includes a plurality of thin film transistors 11 provided on a base substrate 10, first transparent electrodes 12 electrically connected with drain electrodes of the thin film transistors, and second transparent electrodes 13. The array substrate further includes a transparent insulation layer 16 that contacts the second transparent electrodes 13. Where a voltage applied on the transparent insulation layer 16 is larger than a predetermined voltage, the transparent insulation layer 16 is a conductor, and where the voltage applied on the transparent insulation layer 16 is less than the predetermined voltage, the transparent insulation layer 16 is an insulator. The second transparent electrodes 13 include first sub-electrodes arranged into a plurality of rows in a first direction, and second sub-electrodes arranged into a plurality of rows in a second direction. The first sub-electrodes 131 in different rows are insulated from each other, the second sub-electrodes 132 in different rows are insulated from each other, and the first sub-electrodes 131 and the second sub-electrodes 132 are insulated from each other. The first direction is intersected with the second direction.

The array substrate has display function and touch function, which are realized by applying simultaneously common electrode signals on the first sub-electrodes 131 and the second electrodes 132 of the second transparent electrodes 13 during a display period, and applying driving signals and sensing signals on the first sub-electrodes 131 and the second sub-electrodes 132 during a touch period. Based on the above, since the transparent insulation layer 16 that contacts the second transparent electrodes 13 is provided at a side of the second transparent electrodes 13, and the transparent insulation layer 16 has high impedance and conductivity, that is, when a relative low voltage, e.g., of several volts is applied on the transparent insulation layer 16, it presents an insulation characteristics, and when a relative large voltage, e.g., of several tens volts is applied on the transparent insulation layer 16, it presents conductivity, when a certain first sub-electrode 131 or second sub-electrode 132 of the second transparent electrodes 13 has massive charges accumulated thereon, the voltage generated by the massive charges is applied on the transparent insulation layer 16 so that the transparent insulation layer 16 renders conductivity, thus the whole second transparent electrodes 13 are conducted, and the massive charges are spread to other portions of the second transparent electrodes 13, and hence the problem such as noise, visual artifacts, bad sensitivity to touch, and so on caused by charge unbalance can be avoided.

Figure 3:
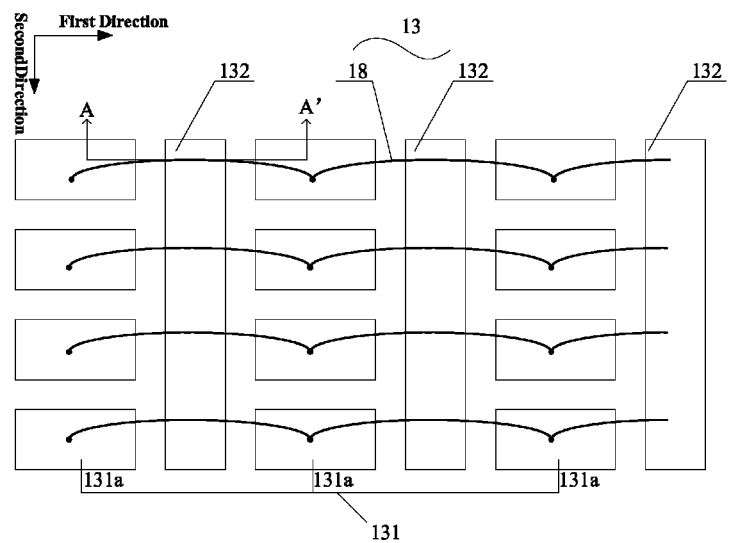
FIG. 3 is a first schematic diagram showing the structure of a second transparent electrode provided by an embodiment of the present invention.
Figure 4:
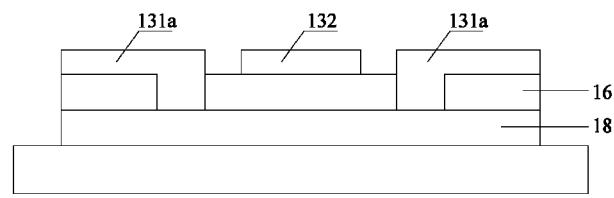
FIG. 4 is a schematic sectional view in a AA' direction in FIG. 3.
Figure 5:
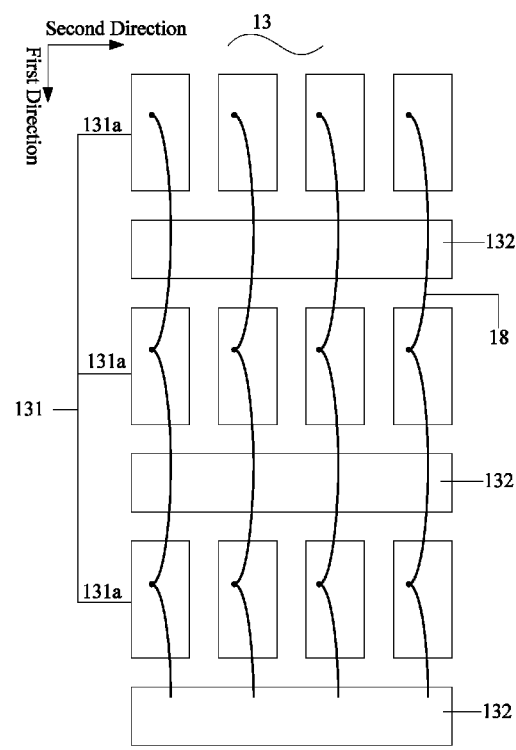
FIG. 5 is a second schematic diagram showing the structure of a second transparent electrode provided by an embodiment of the present invention.

For example, as shown in FIG. 3 to FIG. 5, the first sub-electrodes 131 in each of the rows in the first direction includes a plurality of first sub-electrode segments 131*a* insulated from each other. In this case, the second sub-electrodes 132 in each of the rows in the second direction each can be a unitary body that is directly electrically connected. That is to say, the second sub-electrodes 132 in each of the rows in the second direction each can be extended from one side of the array substrate to the other side parallel with the one side, and any two adjacent first sub-electrode segments 131*a* in each of the rows in the first direction is separated by a row of the second sub-electrode 132 in the second direction. Based on this, the array substrate further includes second metal lines 18 for connecting the first sub-electrode segments 131 in each of the rows.

FIG. 4 is a schematic sectional view showing any two first sub-electrode segments 131*a* in a respective row in FIG. 3 and a second sub-electrode 132 area located between the two first sub-electrode segments 131*a*. In FIG. 4, a second metal line 18 bypassing the second sub-electrode 132 is intersected, in different layers, with the second sub-electrode 132 to form a touch sensing bridge, thus forming a mutual capacitor. Thus, when a human body touches the touch panel, the electrical field of the human body will act on the mutual capacitor so that the capacitance of the capacitor will be changed, and thus the voltage signal coupled by the touch sensing electrode (here, the touch sensing electrodes is the first sub-electrode 131 or the second sub-electrode 132) is varied, and therefore, according to the variation of the induced voltage signal, the touch position can be determined.

Here, in the case where the second transparent electrodes 13 are located between the base substrate 10 and the first transparent electrodes 12, one of the first sub-electrode segments 131*a* may correspond to 10 to 20 sub-pixels. Of course, according to different resolution, one of the first sub-electrode segments 131*a* may also correspond to another number of the sub-pixels.

It is to be noted that firstly, FIG. 4 only schematically shows a portion of the laminated structure for realizing the above touch sensing bridge, and the other structure is not shown.

Secondly, the first sub-electrode 131 may be a touch sensing electrode or may be a touch driving electrode, in this case, the second sub-electrode 132 can be the touch driving electrode or may be the touch sensing electrode.

Thus, when forming the second transparent electrodes 13, it is only necessary to form the first sub-electrode 131 in the first direction into a plurality of first sub-electrode segments 131a insulated from each other, so the process for making the second transparent electrode 13 is simplified.

In at least one embodiment, the first direction is perpendicular to the second direction. In this case, referring to FIG. 3, in the case where the first direction is the same direction as the gate lines 14, for example, the second metal line 18 is provided in the same layer as the gate lines 14. Referring to FIG. 5, in the case where the first direction is the same direction as the data lines 15, for example, the second metal line 18 is provided in the same layer as the date lines 15. Thus, the second metal line 18 can be formed without additional patterning process, so as to save the costs.

Figure 6:
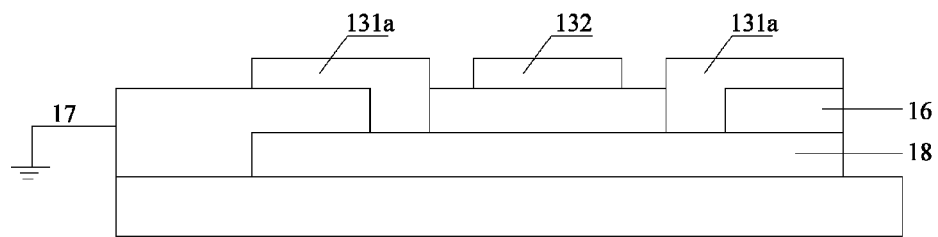
FIG. 6 is a schematic diagram showing the connection between a transparent insulation layer and a grounded metal line provided by an embodiment of the present invention.
Figure 7:
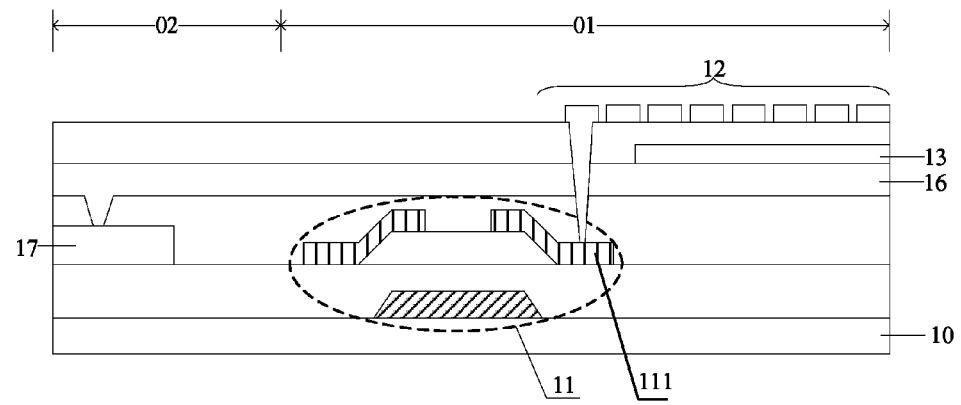
FIG. 7 is a schematic diagram showing the structure of an array substrate provided by an embodiment of the present invention in which a transparent insulation layer is connected with a grounded metal line.

Based on the above embodiment, in one embodiment, as shown in FIG. 6 and FIG. 7, the transparent insulation layer 16 is extended to the peripheral area 02, and the transparent insulation layer 16 located in the peripheral area 02 contacts with the grounded first metal line 17. Thus, the charge accumulated on the second transparent electrodes 13 can be flowed to the first metal line 17 through the transparent insulation layer 16 and thus is grounded.

Herein, the peripheral area is designed so that the first metal line 17 is grounded, and will not be further described. For example, FIG. 6 shows the situation in which the transparent insulation layer 16 is provided in the same layer as the first metal line 17; FIG. 7 shows the situation in which the transparent insulation layer 16 is provided in different layer from the first metal line. But the embodiments of the present invention apply no limitation on which layer the first metal line 17 will be provided.

In at least one embodiment, the composite material is a composite material including carbon nanotube or a composite material including graphene.

Since the carbon nanotube and the graphene both have excellent conductivity, by adjusting the amount of the carbon nanotube or the grapheme to be included, the resistivity of the transparent insulation layer 16 formed by the composite material can be adjusted, and thus the value of the voltage applied on the transparent insulation layer 16 when the transparent insulation layer 16 renders conductor character can be controlled.

In at least one embodiment of the present invention, the resistivity of the transparent insulation layer 16 may be larger than or equal with $10^3$ ohmm, less than or equal with $10^6$ ohmm.

Of course, the array substrate provided by the embodiments of the present invention may further include other structure provided on the first transparent electrodes 12, such as a passivation layer, and so on. It will not be further described here.

At least one embodiment of the present invention provides a method for manufacturing an array substrate including a display area 01 and a peripheral area 02, as shown in FIG. 1 and FIG. 2, the method includes, in the display area 01, forming a plurality of thin film transistors 11 located on a base substrate 10, forming first transparent electrodes 12 electrically connected with drain electrodes 111 of the thin film transistors 11 and second transparent electrodes 13, and forming a transparent insulation layer 16 that contacts the second transparent electrodes 13. In the case where a voltage applied on the transparent insulation layer 16 is larger than a predetermined voltage, the transparent insulation layer 16 becomes a conductor, and in the case where the voltage applied on the transparent insulation layer 16 becomes less than the predetermined voltage, the transparent insulation layer 16 is an insulator.

In the embodiment of the present invention, the second transparent electrodes 13 include first sub-electrodes 131 arranged into a plurality of rows in a first direction and second sub-electrodes 132 arranged into a plurality of rows in a second direction. The first sub-electrodes 131 in different rows are insulated from each other, the second sub-electrodes 132 in different rows are insulated from each other, and the first sub-electrodes 131 and the second sub-electrodes 132 are insulated from each other. The first direction is intersected with the second direction.

In at least one embodiment, the material for the transparent insulation layer 16 may include a composite material, of course, there is no limitation in the embodiment of the present invention, the transparent insulation layer 16 may be formed by other materials, as long as the material is such that the transparent insulation layer 16 becomes a conductor in the case where the voltage applied thereon is larger than the predetermined voltage and becomes an insulator in the case where the voltage applied thereon is less than the predetermined voltage.

It is to be noted that the order for forming the first transparent electrodes 12 and the second transparent electrodes 13 is not limited, for example, the second transparent electrodes 13 can be firstly formed, and then the first transparent electrodes 12 are formed.

In addition, since in the case where the voltage applied on the transparent insulation layer 16 is larger than the predetermined voltage, the transparent insulation layer 16 becomes a conductor, and the transparent insulation layer 16 contacts the second transparent electrodes 13, as known by the person skilled in the art, when the pattern layer located above or below the transparent insulation layer 16, e.g., the material for the source/drain metal layer, is conductive material and the second transparent electrodes 13 are not electrically connected with the pattern layer, it is necessary to form a fully insulation layer of e.g., silicon oxide and/or silicon nitride between the conductive pattern layer and the transparent insulation layer 16.

In the embodiment of the present invention, by applying a common electrode signal simultaneously to the first sub-electrodes 131 and the second sub-electrodes 132 of the second transparent electrodes during the display period and applying a driving signal and a sensing signal to the first sub-electrodes 131 and the second sub-electrodes 132 during the touch period, the array substrate may both have the display and touch functions. Based on the above, since at a side of the second transparent electrodes 13, the transparent insulation layer 16 that contacts the second transparent electrodes 13 is formed, and the transparent insulation layer 16 has high impedance and conductivity, that is, when a relatively small voltage, e.g., in several volts, is applied to the transparent insulation layer 16, it presents insulation property, and when a relatively large voltage, e.g., in several tens volts is applied to the transparent insulation layer 16, it presents conductivity. Therefore, when massive charges are accumulated on a certain one of the first sub-electrodes or the second sub-electrodes 132 of the second transparent electrodes 13, the transparent insulation layer 16 will be allowed to be conductive, and thus the whole second transparent electrodes 13 are conducted, and the above described massive charge is spread to other portions of the second transparent electrodes 13, and hence the problems such as noise, visual artifacts, bad sensitivity to touch, and so on caused by charge unbalance can be avoided.

In one embodiment, referring to FIG. 6 and FIG. 7, the display area 01 and the peripheral area 02 are all provided with the transparent insulation layer 16. In this case, the method further includes forming a first metal line 17 contacted with the transparent insulation layer 16 in the peripheral area 02, the first metal line 17 being grounded. Thus, the charges accumulated on the second transparent electrodes 13 can also be flowed to the first metal line 17 through the transparent insulation layer 16, and thus is grounded.

Here, the peripheral area can be designed so that the first metal line 17 is grounded, and will not be further described in detail. Furthermore, there is no specific limitation on which layer the first metal line 17 is formed.

In an embodiment, referring FIG. 3 to FIG. 5, forming the second transparent electrodes 13 may include: forming a plurality rows of first sub-electrodes 131 in a first direction, and the first sub-electrodes 131 in each of the rows including a plurality of first sub-electrode segments 131a insulated from each other; forming a plurality rows of second sub-electrodes 132 in a second direction, the second sub-electrodes in each of the rows are formed as a unitary piece that is directly electrically connected; any two adjacent first sub-electrode segments 131a in each of the rows in the first direction is separated by a row of the second sub-electrodes 132 in the second direction. Based on the above, the method further includes forming a second metal line 18 for connecting the first sub-electrode segments 131a in each of the rows.

In at least one embodiment, the first direction is perpendicular to the second direction. In this case, referring to FIG. 3, if first direction is the same direction as the gate line 14, for example, the second metal line 18 can be formed by the same patterning process as the gate line 14. Referring to FIG. 5, if the first direction is the same direction as the data line 15, for example, the second metal line 18 can be formed by the same patterning process as the data line 14.

Based on the above embodiment, in at least one embodiment, the composite material is a composite material including carbon nanotube or graphene.

Since the carbon nanotube and the graphene both have excellent conductivity, by adjusting the amount of the carbon nanotube or the grapheme to be included, the resistivity of the transparent insulation layer 16 formed by the composite material can be adjusted, and thus the value of the voltage applied on the transparent insulation layer 16 when the transparent insulation layer 16 renders conductor character can be controlled.

In at least one embodiment of the present invention, the resistivity of the transparent insulation layer 16 may be larger than or equal with $10^3$ ohmm, less than or equal with $10^6$ ohmm.

Of course, the method for manufacturing the array substrate as provided by the embodiments of the present invention may further include the steps of forming a passivation layer on the first transparent electrodes, and so on, and will not be further described.

At least one embodiment of the present invention provides a touch display device including the above array substrate.

In the embodiment of the present invention, during a display period, by simultaneously applying the common electrode signal to the first sub-electrodes 131 and the second sub-electrodes 132 of the second transparent electrodes 13 so as to cooperate with the first transparent electrode 12 to drive the liquid crystal to achieve the display function. During a touch period, by applying the driving signal and the sensing signal to the first sub-electrode 131 and the second sub-electrode 132, to achieve the touch function.

The display device may be any product or component having display function, such as a liquid crystal display, a television, a digital photo frame, a mobile phone, a tablet computer, and so on.

The present disclosure has been described above by way of the exemplary embodiment, and the protection scope of the present disclosure would not be limited therein, and is only defined by the following claims.

The present application claims the priority of Chinese Patent Application No. 201410323275.9 filed on Jul. 8, 2014, the Chinese Patent Application is entirely incorporated therein as a part of the present application by reference.

What is claimed is:

1. An array substrate including a display area and a peripheral area, wherein:
   the display area includes a plurality of thin film transistors provided on a base substrate, first transparent electrodes electrically connected with drain electrodes of the thin film transistors, second transparent electrodes, and a transparent insulation layer that contacts the second transparent electrodes, wherein the thin film transistors and the first and second transparent electrodes function as display pixels;
   the transparent insulation layer is applied a voltage such that, in the case where the voltage applied on the transparent insulation layer is larger than a predetermined voltage, the transparent insulation layer becomes a conductor, and in the case where the voltage applied on the transparent insulation layer is less than the predetermined voltage, the transparent insulation layer becomes an insulator;
   the second transparent electrodes include first sub-electrodes arranged into a plurality of rows in a first direction, and second sub-electrodes arranged into a plurality of rows in a second direction;
   the first sub-electrodes in different rows are insulated from each other, the second sub-electrodes in different rows are insulated from each other, and the first sub-electrodes and the second sub-electrodes are insulated from each other;
   the first direction is intersected with the second direction;
   the transparent insulation layer is extended into the peripheral area;
   the peripheral area includes a grounded first metal line; and
   the transparent insulation layer is electrically connected to the grounded first metal line in the peripheral area, and charges accumulated on the second transparent electrodes flow from the second transparent electrodes to the grounded first metal line through the transparent insulation layer when the transparent insulation layer becomes the conductor.

2. The array substrate according to claim 1, wherein a material of the transparent insulation layer includes a composite material.

3. The array substrate according to claim 2, wherein the composite material is a composite material including carbon nanotube or a composite material including graphene.

4. The array substrate according to claim 1, wherein:
   the first sub-electrodes in each of the rows in the first directions include a plurality of first sub-electrode segments insulated from each other, and the second sub-electrodes in each of the rows in the second directions each is a unitary body that is directly electrically connected, any two adjacent first sub-electrode segments in each of the rows are separated by a row of the second sub-electrode; and the array substrate further includes a second metal line for connecting the first sub-electrode segments in each of the rows.

5. The array substrate according to claim 4, wherein the first direction is perpendicular to the second direction.

6. The array substrate according to claim 5, wherein the first direction is a same direction as a gate line; or
the first direction is a same direction as a data line.

7. The array substrate according to claim 1, wherein the first direction is perpendicular to the second direction.

8. The array substrate according to claim 7, wherein the first direction is a same direction as a gate line; or
the first direction is a same direction as a data line.

9. The array substrate according to claim 1, wherein:
during a display period, both the first sub-electrodes and the second sub-electrodes serve as common electrodes configured to be applied with common electrode signals; and
during a touch period, the first sub-electrodes in different rows serve as different touch driving electrodes configured to be applied with driving signals, and the second sub-electrodes in different rows serve as different touch sensing electrodes configured to be applied with sensing signals.

10. A method for manufacturing an array substrate that includes a display area and a peripheral area, comprising:
in the display area, forming a plurality of thin film transistors located on a base substrate, first transparent electrodes electrically connected with drain electrodes of the thin film transistor, second transparent electrodes, and a transparent insulation layer that contacts the second transparent electrodes; wherein:
the thin film transistors and the first and second transparent electrodes function as display pixels;
the transparent insulation layer is configured to receive an applied voltage such that, in the case where the voltage applied on the transparent insulation is larger than a predetermined voltage, the transparent insulation layer becomes a conductor, and in the case where the voltage applied on the transparent insulation layer is less than the predetermined voltage, the transparent insulation layer becomes an insulator;
the second transparent electrodes include first sub-electrodes arranged into a plurality of rows in a first direction, and second sub-electrodes arranged into a plurality of rows in a second direction;
the first sub-electrodes in different rows are insulated from each other, the second sub-electrodes in different rows are insulated from each other, and the first sub-electrodes and the second sub-electrodes are insulated from each other;
the first direction is intersected with the second direction;
forming the transparent insulation layer includes forming the transparent insulation layer both in the display area and the peripheral area; and
the method further includes forming a first metal line in the peripheral area, wherein the first metal line is electrically connected to the transparent insulation layer in the peripheral area, and the first metal line is grounded, and charges accumulated on the second transparent electrodes flow, from the second transparent electrodes to the grounded first metal line through the transparent insulation layer when the transparent insulation layer becomes the conductor.

11. The method according to claim 10, wherein a material of the transparent insulation layer is a composite material.

12. The method according to claim 11, wherein the composite material is a composite material including carbon nanotube or composite material including graphene.

13. A touch display device including the array substrate according to claim 1.

* * * * *